(12) United States Patent
Hori

(10) Patent No.: US 9,991,904 B2
(45) Date of Patent: Jun. 5, 2018

(54) DIGITAL MODULATION DEVICE, AND DIGITAL MODULATION METHOD

(71) Applicant: NEC Corporation, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days. days.

(21) Appl. No.: 15/513,266

(22) PCT Filed: Sep. 17, 2015

(86) PCT No.: PCT/JP2015/004763
§ 371 (c)(1),
(2) Date: Mar. 22, 2017

(87) PCT Pub. No.: WO2016/051710
PCT Pub. Date: Apr. 7, 2016

(65) Prior Publication Data
US 2017/0310338 A1    Oct. 26, 2017

(30) Foreign Application Priority Data

Sep. 30, 2014 (JP) .................................. 2014-199503

(51) Int. Cl.
*H03M 3/00* (2006.01)
*H03F 3/217* (2006.01)
(Continued)

(52) U.S. Cl.
CPC .............. *H03M 3/39* (2013.01); *H03F 3/217* (2013.01); *H03M 9/00* (2013.01); *H04L 27/36* (2013.01); *H03F 2200/171* (2013.01)

(58) Field of Classification Search
CPC ............ H03M 3/39; H03M 9/00; H03M 3/30; H03M 3/50; H03M 7/3004; H03M 1/66;
(Continued)

(56) References Cited

U.S. PATENT DOCUMENTS 5,124,706 A * 6/1992 Gerdes ............. G11B 20/10527
341/145
5,142,286 A * 8/1992 Ribner .................. H03M 3/344
341/143
(Continued)

FOREIGN PATENT DOCUMENTS

JP           6-209266 A     7/1994
JP      2005-006273 A       1/2005
(Continued)

OTHER PUBLICATIONS

Antoine Frappé, et al., "A digital ΔΣ RF signal generator for mobile communication transmitters in 90nm CMOS", IEEE Radio Frequency Integrated Circuits Symposium, Jun. 2008, pp. 13-16.
(Continued)

*Primary Examiner* — Jean B Jeanglaude
(74) *Attorney, Agent, or Firm* — Sughrue Mion, PLLC

(57) ABSTRACT

A digital modulation device is provided. The digital modulation device includes an input unit; N delta-sigma modulation units; and an output unit. N is an integer greater than or equal to 2, the input unit is configured to: input initial values which differ from each other to the N delta-sigma modulation units; and then, input a same first signal into the N delta-sigma modulation units, each of the N delta-sigma modulation units is configured to: output a second signal by performing delta-sigma modulation processing on the first signal for each first clock cycle, and the output unit is configured to: sequentially output each second signal for each one Nth of the first clock cycle.

6 Claims, 16 Drawing Sheets

(51) Int. Cl.
*H03M 9/00* (2006.01)
*H04L 27/36* (2006.01)

(58) Field of Classification Search
CPC .......... H03M 1/747; H03M 1/00; H03M 1/72; H04L 27/36; H03F 3/217; H03F 2200/171
USPC ........................................ 341/143, 144, 145
See application file for complete search history.

(56) References Cited

U.S. PATENT DOCUMENTS

| | | | |
|---|---|---|---|
| 6,252,533 B1 * | 6/2001 | Tafuru | H04M 1/505 |
| | | | 341/144 |
| 7,289,054 B1 | 10/2007 | Watanabe | |
| 2004/0252038 A1 | 12/2004 | Robinson et al. | |
| 2015/0263768 A1 | 9/2015 | Hori et al. | |

FOREIGN PATENT DOCUMENTS

| | | | |
|---|---|---|---|
| JP | 2009-540656 A | 11/2009 |
| JP | 5360232 B2 | 12/2013 |
| WO | 2008/114236 A2 | 9/2008 |
| WO | 2014/042270 A1 | 3/2014 |

OTHER PUBLICATIONS

International Search Report of PCT/JP2015/004763, dated Nov. 24, 2015. [PCT/ISA/210].
Written Opinion of PCT/JP2015/004763, dated Nov. 24, 2015. [PCT/ISA/237].

* cited by examiner

14
FREQUENCY DIVIDER

DIGITAL MODULATION DEVICE, AND DIGITAL MODULATION METHOD

CROSS REFERENCE TO RELATED APPLICATIONS

This application is a National Stage of International Application No. PCT/JP2015/004763 filed Sep. 17, 2015, claiming priority based on Japanese Patent Application No. 2014-199503, filed Sep. 30, 2014, the contents of all of which are incorporated herein by reference in their entirety.

TECHNICAL FIELD

The present invention relates to a digital modulation device and the like which are used as communication equipment, broadcasting equipment, and the like in a cellular phone system, a wireless LAN (Local Area Network) system, and the like.

BACKGROUND ART

Transmitters used as communication equipment, broadcasting equipment, and the like in a cellular phone system, a wireless LAN system, and the like are required to operate with low power consumption, while maintaining a transmission waveform at high accuracy, without depending on magnitude of transmission power. In particular, a power amplifier for transmission that is provided at the final stage of the transmitter is required to have high power efficiency because of consuming a large amount of power.

In recent years, a switching amplifier has been paid attention as the power amplifier which is expected to have high power efficiency. The switching amplifier is specified to receive a pulse waveform signal as an input signal and amplifies electric power in a state where the pulse waveform is maintained. The pulse waveform signal amplified by the switching amplifier is radiated from an antenna as a radio signal after frequency components in a frequency band other than a frequency band of a desired radio signal are removed by a filter element.

FIG. 13 is a block diagram illustrating a configuration example of an amplifier called a class-D amplifier or a class-S amplifier (hereinafter these amplifiers are collectively called a class-D amplifier) which is a typical example of the switching amplifier. FIG. 13 illustrates a configuration example of a class-D amplifier that amplifies a binary signal representing a logic "1" or "0".

In a class-D amplifier 50 illustrated in FIG. 13, a switching element 51 is disposed between a power supply and an output terminal, and a switching element 52 is disposed between the output terminal and a ground potential. The switching elements 51 and 52 input complementary pulse signals as open/close control signals and are controlled in such a manner that only one of the switching elements is turned on. The class-D amplifier 50 outputs a potential (high level: logic "1") which is indicated by a power supply voltage, when the switching element 51 is ON and the switching element 52 is OFF. The class-D amplifier 50 outputs a ground potential (low level: logic "0") when the switching element 51 is OFF and the switching element 52 is ON.

The class-D amplifier 50, which requires no bias current, is ideally capable of reducing a power loss to zero. For example, field effect transistors or bipolar transistors may be used as the switching elements 51 and 52.

A transmitter illustrated in FIG. 14 is known as a first example of the typical transmitter using the class-D amplifier 50 illustrated in FIG. 13. This transmitter is a binary transmitter including a combination of delta-sigma ($\Delta\Sigma$) modulators for converting a baseband signal into a binary signal as described in NPL 1. In this transmitter, delta-sigma modulators 61 and 62 which are included in an RF (Radio Frequency) signal generator 60 perform delta-sigma modulation on I (In-phase)Q (Quadrature-phase) signals generated by a digital baseband signal generator 80. Further, the RF signal generator 60 performs digital upconversion to generate an RF-band digital signal. In this transmitter, the class-D amplifier 50 amplifies the RF-band digital signal, which is generated by the RF signal generator 60, to a desired level. The amplified RF digital signal is output as a radio signal from an antenna 83 through a bandpass filter 82.

FIG. 15 illustrates a second example of the typical transmitter which is described in PTL 1 and uses the class-D amplifier 50 illustrated in FIG. 13. In this transmitter, the digital baseband signal generator 80 generates an amplitude signal and a phase signal, and then a delta-sigma modulator 71 included in an RF signal generator 70 performs delta-sigma modulation on the amplitude signal. The RF signal generator 70 performs digital upconversion of the phase signal generated by the digital baseband signal generator 80, thereby generating an RF-band phase signal. The RF signal generator 70 multiplies a signal output from the delta-sigma modulator 71 by the generated RF-band phase signal, thereby generating the RF-band digital signal.

A demand for communication accuracy in a cellular phone system, a wireless LAN system, and the like has been severe year after year. Accordingly, expectations for techniques for efficiently improving a signal-to-noise power ratio (SNR) in such a transmitter have been increasing.

As an example of such techniques, PTL 2 discloses a transmitter including a plurality of digital transmitters that perform delta-sigma modulation on the same baseband signal and output the modulated signal. This transmitter includes a combiner that synthesizes output signals from the plurality of digital transmitters and outputs the synthesized signal, and a controller that generates different external signals for each of the digital transmitters. Further, the transmitter outputs different external signals for each of the digital transmitters to an input terminal or an internal node of each delta-sigma modulator included in the digital transmitters.

PTL 3 discloses a sigma-delta analog-to-digital (AD) converter having a configuration in which delta-sigma modulators are connected in parallel and each delta-sigma modulator operates in accordance with a clock signal whose phase is temporally shifted. In the sigma-delta AD converter, outputs from a plurality of delta-sigma modulators are combined by a multiplexer circuit or the like.

CITATION LIST

Patent Literature

[PTL 1] Japanese Patent No. 5360232
[PTL 2] International Patent Publication No. WO 2014/042270
[PTL 3] Japanese Laid-open Patent Publication No. 1994 (H06)-209266

Non Patent Literature

[NPL 1] A. Frappe, B. Stefanelli, A. Flament, A. Kaiser and A. Cathelin, "A digital $\Delta\Sigma$ RF signal generator for mobile communication transmitters in 90 nm CMOS," in IEEE RFIC Symp., pp. 13-16, June 2008.

SUMMARY OF INVENTION

Technical Problem

The delta-sigma modulators included in the transmitters illustrated in FIGS. 14 and 15 operate at a frequency that is sufficiently higher than a frequency for an input signal, thereby greatly reducing quantization noise, which is generated when the input signal is converted into a binary signal, in the vicinity of a desired band.

FIG. 16 is a diagram illustrating a configuration example of a primary delta-sigma modulator as a typical delta-sigma modulator. A delta-sigma modulator 61 includes an adder 610, delay units 611 and 612, and a quantizer 613. A transfer function for a signal processed by the delta-sigma modulator 61 is expressed by the following formula where the input signal is represented by IN(z) and the output signal is represented by OUT(z).

$$\mathrm{Out}(z) = \mathrm{IN}(z) + (1-z^{-1}) \cdot N(z) \quad \text{(Formula 1)}$$

$$z = \exp(j \cdot f/fs) \quad \text{(Formula 2)}$$

In the above formulas, N(z) represents quantization noise generated in the quantizer 613; f represents a frequency domain for the signal to be processed; and fs represents an operating frequency for the delta-sigma modulator 61. Further, in the above formulas, "·" denotes an operator representing a multiplication; "/" denotes an operator representing a division; and "exp" denotes an exponential function.

As represented in Formula 1, the quantization noise N(z) is multiplied by $(1-z^{-1})$ as a coefficient. This indicates that as the operating frequency fs for the delta-sigma modulator 61 is increased in comparison to the frequency domain f for the input signal, $z^{-1}$ approaches 1 as represented in Formula 2, with the result that noise components included in the output signal are reduced and thus SNR is improved.

An operation speed limitation for the delta-sigma modulator depends on speed performance of a device, such as a CMOS (Complementary Metal-Oxide Semiconductor), on which the delta-sigma modulator is integrated. In general, as miniaturization of the CMOS device advances, the speed performance of the CMOS device is improved. However, under a present circumstance, the speed performance is limited to approximately the first half of several GHz (giga-hertz).

On the other hand, due to recent increase in demand for data communication, signal frequency bands to be allocated to cellular phones or wireless LAN standards tend to increase. Accordingly, in order to ensure a sufficient SNR, the delta-sigma modulator is required to operate at frequencies in the latter half of several GHz or higher. Therefore, it has become difficult for the delta-sigma modulator using the current CMOS device to achieve a sufficiently high SNR.

The techniques disclosed in PTLs 1 to 3 and NPL 1 are insufficient to effectively solve the above-mentioned problem. A main object of the present invention is to provide a digital modulation device and the like that effectively solves the above-mentioned problem.

Solution to Problem

A digital modulation device according to one aspect of the present invention includes: a setting means; N (N is an integer equal to or greater than 2) delta-sigma modulation means; and a serial output means. The setting means sets initial values which differ from each other to the N delta-sigma modulation means. The N delta-sigma modulation means respectively perform delta-sigma modulation processing on an input signal for each clock cycle indicated by a first clock signal, and then output a modulated signal including a noise signal having a value that varies depending on the initial value. The serial output means sequentially serializes the modulated signals output by the N delta-sigma modulation means for each clock cycle indicated by a second clock signal, and outputs serialized signals, the clock cycle of the second clock signal being 1/N of the clock cycle of the first clock signal.

In another point of view of attaining the above-mentioned object, a digital modulation method according to another aspect of the present invention includes: setting, by a setting means, initial values which differ from each other to N delta-sigma modulation means; generating, by the N delta-sigma modulation means, modulated signals each including a noise signal having a value that varies depending on the initial value, by performing delta-sigma modulation processing on an input signal for each clock cycle indicated by a first clock signal; and sequentially serializing, by a serial output means, the modulated signals for each clock cycle indicated by a second clock signal, the clock cycle of the second clock signal being 1/N of the clock cycle of the first clock signal.

Advantageous Effects of Invention

The present invention is able to efficiently improve a signal-to-noise power ratio without increasing an operating frequency for a delta-sigma modulator.

DESCRIPTION OF EMBODIMENTS

Example embodiments of the present invention will be described in detail below with reference to the drawings.

<First Example Embodiment>

Figure 1:
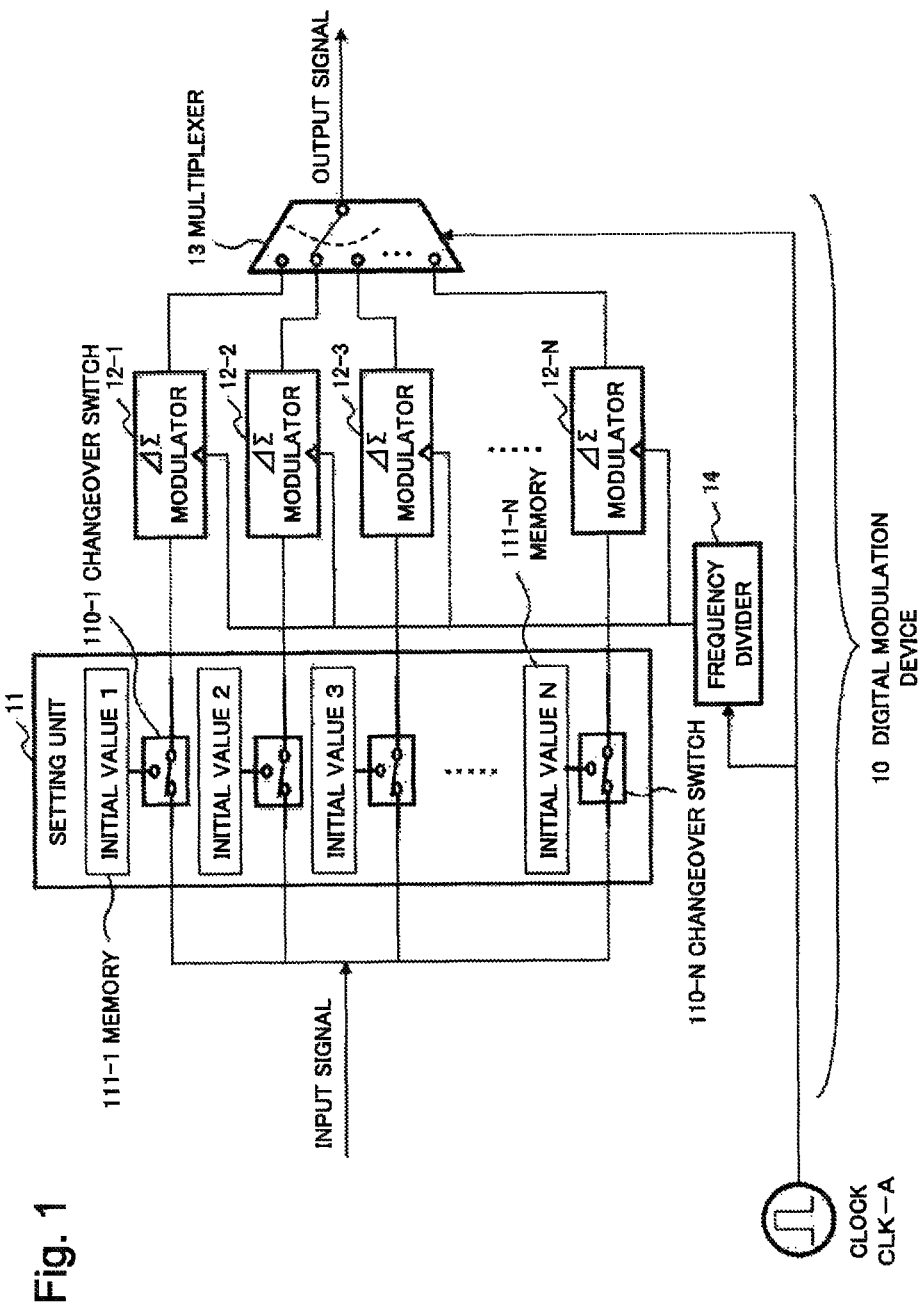
FIG. 1 is a block diagram illustrating a configuration of a digital modulation device according to a first example embodiment of the present invention.

FIG. 1 is a block diagram conceptually illustrating a configuration of a digital modulation device 10 according to a first example embodiment. The digital modulation device 10 according to this example embodiment includes a setting unit 11, N (N is an arbitrary integer equal to or greater than 2) delta-sigma modulators (ΔΣ modulators) 12-1 to 12-N, a multiplexer (serial output unit) 13, and a frequency divider 14.

The setting unit 11 includes N changeover switches 110-1 to 110-N. The changeover switches 110-1 to 110-N are switches that select one of two input signals and output the selected signal. First inputs of the changeover switches 110-1 to 110-N are respectively connected to memories 111-1 to 111-N which store initial values 1 to N, respectively, which are initial values set to the delta-sigma modulators 12-1 to 12-N, respectively. Assume that different values are set as the initial values 1 to N, respectively. A signal path for inputting the input signal is connected to second inputs of the changeover switches 110-1 to 110-N. When the digital modulation device 10 is in the initial state, the changeover switches 110-1 to 110-N each output the first input. After the digital modulation device 10 starts operation (i.e., the digital modulation device 10 has input the input signal), the changeover switches 110-1 to 110-N each output the second input. The changeover switch 110-1 outputs an output signal to the delta-sigma modulator 12-1. The changeover switches 110-2 to 110-N also output output signals to the delta-sigma modulators 12-2 to 12-N, respectively.

The multiplexer 13 is an N-to-1 multiplexer including N input signal paths and one output signal path. The multiplexer 13 operates in synchronization with an external clock signal CLK-A which has a clock frequency of A (A is an arbitrary positive number). The multiplexer 13 sequentially switches output signals from the delta-sigma modulators 12-1 to 12-N for each clock cycle, and outputs the switched output signals. The multiplexer 13 repeatedly executes the operation of outputting the output signal from the delta-sigma modulator 12-N and then sequentially outputting the output signals in order from the delta-sigma modulator 12-1.

The frequency divider 14 generates a clock signal by dividing the frequency of the external clock signal CLK-A by a factor of N, and outputs the generated clock signal to each of the delta-sigma modulators 12-1 to 12-N. In other words, the frequency at which the delta-sigma modulators 12-1 to 12-N operate is represented by A/N, and the clock signals input to the delta-sigma modulators 12-1 to 12-N, respectively, have the same phase.

Figure 3:
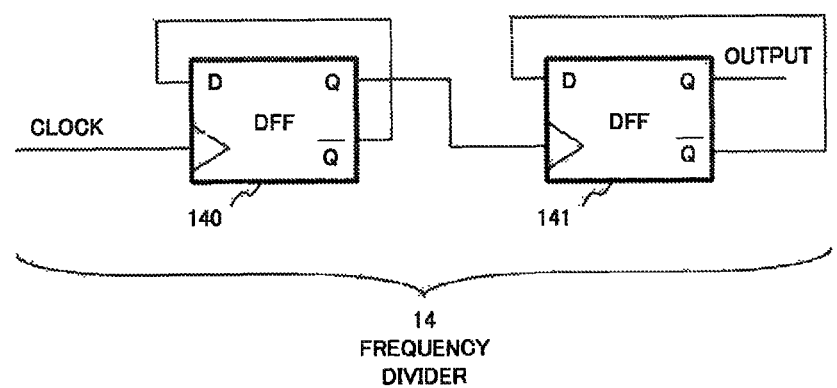
FIG. 3 is a diagram illustrating a configuration of a frequency divider according to the first example embodiment of the present invention.
Figure 4:
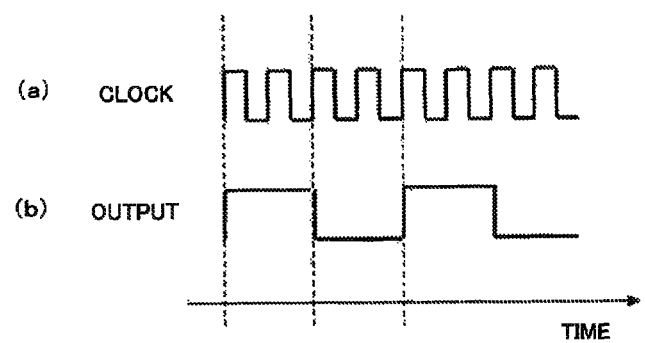
FIG. 4 is a diagram illustrating a time chart for a clock signal input from the frequency divider to a delta-sigma modulator when the frequency divider according to the first example embodiment of the present invention has the configuration illustrated in FIG. 3.

FIG. 3 illustrates a configuration example of the frequency divider 14 when the value N is 4. In this case, as illustrated in FIG. 3, the frequency divider 14 is implemented by two DFFs (D-type Flip-Flops) 140 and 141 having a feedback configuration. When the clock signal illustrated in FIG. 4(a) is input to the DFF 140, the signal obtained by dividing the frequency of the clock signal by a factor of 4 is output from the DFF 141 as illustrated in FIG. 4(b). Note that the configuration of the frequency divider 14 is not limited to the configuration illustrated in FIG. 3. When the value N is equal to or greater than 4, the frequency divider 14 can be implemented by increasing the number of DFFs.

As illustrated in FIG. 1, the delta-sigma modulators 12-1 to 12-N perform delta-sigma modulation processing on the input signal and then output the signal to the multiplexer 13.

Assume herein that the output signal from the delta-sigma modulator 12-$k$ is represented by DSMout_k(t). Note that k represents an integer of any one of 1 to N, and t represents a variable indicating time. The multiplexer 13 performs the operation of sequentially switching and outputting the signals output from the delta-sigma modulators 12-1 to 12-N for each clock cycle of the frequency A. Accordingly, an output signal MUXout from the multiplexer 13 is represented by the following Formula 3.

$$\text{MUXout}(t) = \sum_{k=1}^{N} (\text{DSMout\_}k(t) \cdot \text{Rect\_}k(t)) \quad \text{(Formula 3)}$$

Figure 2:
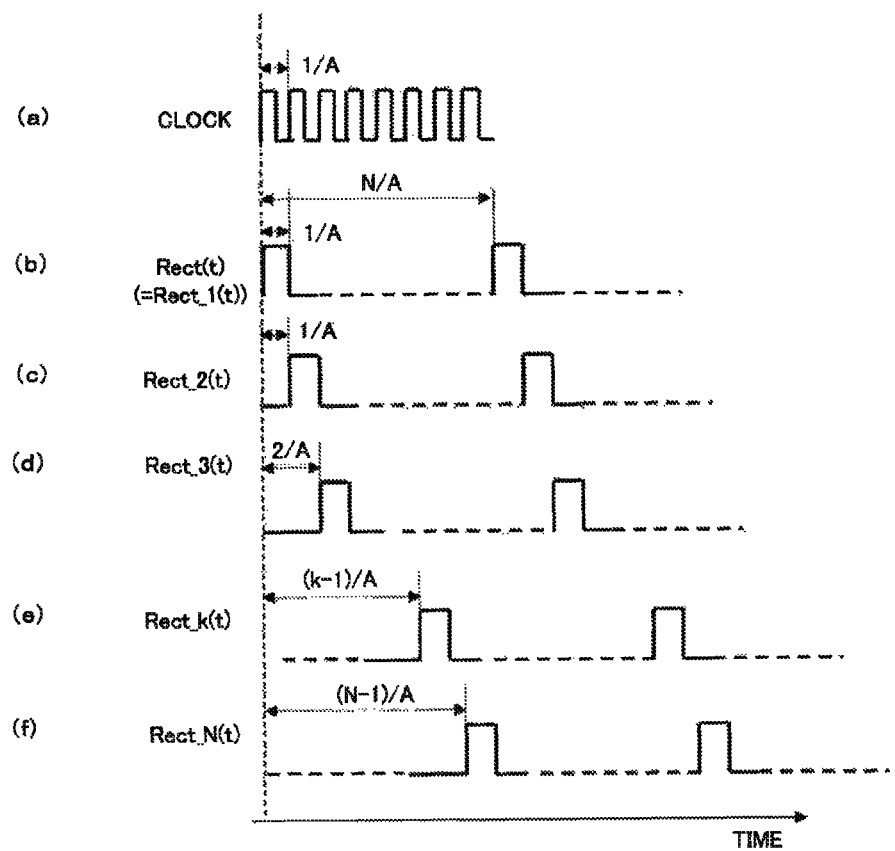
FIG. 2 is a diagram illustrating a time chart for signals Rect(t) and Rect_k(t) according to the first example embodiment of the present invention.

Note that Rect_k(t) represents a signal having a time delay indicated by a value (k−1)/A, as shown in FIG. 2 and Formulas 4 and 5, with respect to a pulse source signal Rect(t) having a pulse width of 1/A and a cycle of N/A.

$$\text{Rect}(t) = 1 \text{ for } m \cdot N/A <= t < (m \cdot N+1)/A \quad \text{(Formula 4)}$$

where m represents an integer equal to or greater than 0
=0 for the other cases $$\text{Rect\_}k(t) = \text{Rect}(t-(k-1)/A) \quad \text{(Formula 5)}$$

Rect(t) can be calculated by Fourier series expansion as represented by Formula 6, because the DC component (time average value for one cycle) is represented by 1/N and the cycle is represented by N/A.

$$Rect(t) = 1/N + \sum_{m=1}^{\infty} \left( a_m \sin\left(2\pi \frac{A}{N} \cdot m \cdot t\right) + b_m \cos\left(2\pi \frac{A}{N} \cdot m \cdot t\right) \right) \quad \text{(Formula 6)}$$

In Formula 6, "sin" and "cos" represent a sine and a cosine, respectively, in a trigonometric function.

Accordingly, Rect_k(t) is represented by Formula 7 based on Formulas 5 and 6.

$$\text{Rect\_}k(t) = 1/N + \sum_{m=1}^{\infty} \left( a_m \sin\left(2\pi \frac{A}{N} \cdot m \cdot \left(t - \frac{k-1}{A}\right)\right) + b_m \cos\left(2\pi \frac{A}{N} \cdot m \cdot \left(t - \frac{k-1}{A}\right)\right) \right) \quad \text{(Formula 7)}$$

Accordingly, Formula 3 can be rewritten as shown in Formula 8.

$$MUXout(t) = 1/N \cdot \sum_{k=1}^{N} (DSMout\_k(t)) + \sum_{k=1}^{N} \left(DSMout\_k(t) \cdot \sum_{m=1}^{\infty} \left(a_m \sin\left(\frac{A}{N} \cdot m \cdot \left(t - \frac{k-1}{A}\right)\right) + b_m \cos\left(\frac{A}{N} \cdot m \cdot \left(t - \frac{k-1}{A}\right)\right)\right)\right)$$

(Formula 8)

The second term on the right-hand side of Formula 8 corresponds to a signal generated by multiplying a sine function or a cosine function having a time t in a phase term by the first term on the right-hand side. Specifically, the signal represented by the second term on the right-hand side corresponds to a signal obtained by upconverting the signal represented by the first term on the right-hand side to a high-frequency band. Therefore, in a low-frequency band in which the signal represented by the first term on the right-hand side is present, the approximation shown in Formula 9 is established.

$$MUXout(t) \approx 1/N \cdot \Sigma_{k=1}^{N}(DSMout\_k(t))$$ (Formula 9)

Figure 14:
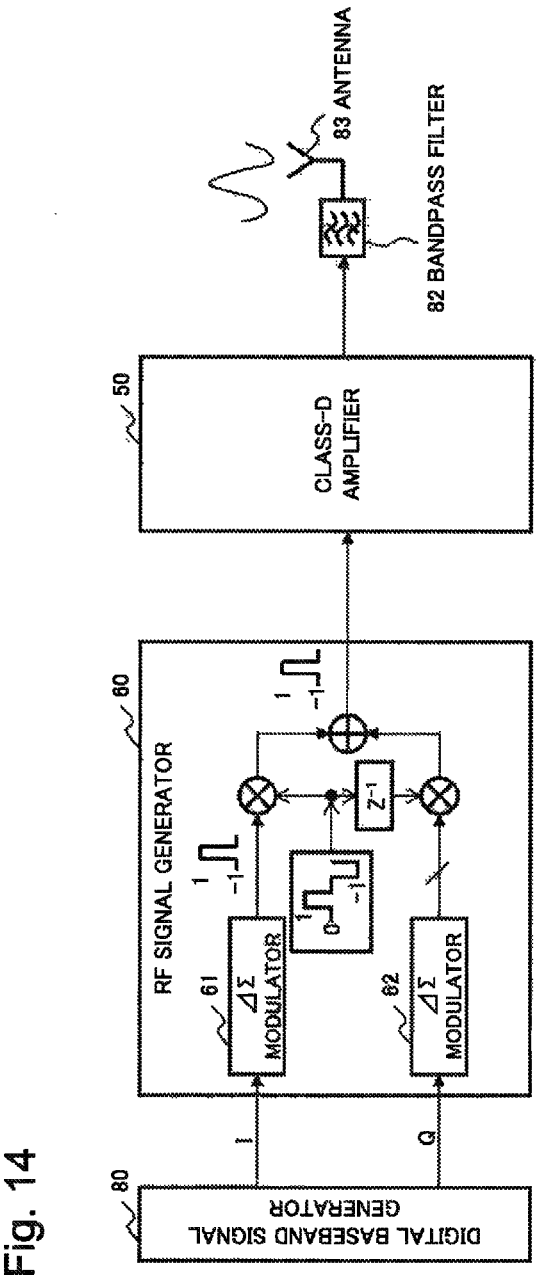
FIG. 14 is a diagram illustrating a first configuration example of a transmitter using the typical class-D amplifier.
Figure 16:
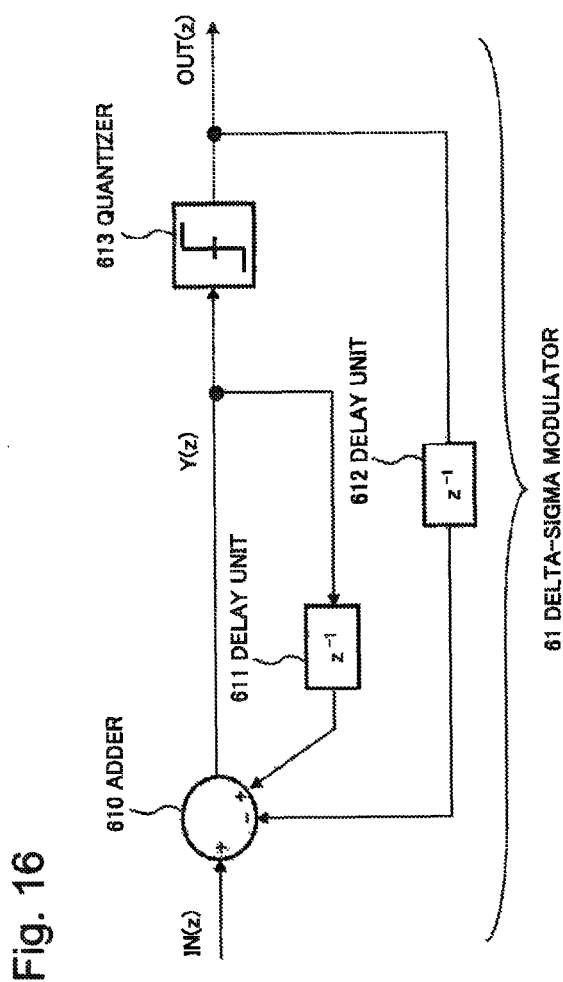
FIG. 16 is a diagram illustrating a configuration of a typical delta-sigma modulator.

Specifically, the output from the multiplexer 13 is equal to the value obtained by dividing the sum of the output signals from the delta-sigma modulators 12-1 to 12-N by the value N. In this case, when the delta-sigma modulators 12-1 to 12-N are equivalent to the primary delta-sigma modulator 61 illustrated in FIG. 14, an output Y(n) from the adder 610 illustrated in FIG. 16 and an output OUT(n) from the delta-sigma modulator 61 are represented by Formulas 10 and 11, respectively.

$$Y(n)=Y(n-1)+IN(n)-OUT(n-1)$$ (Formula 10)

$$OUT(n)=Y(n)+N(n)$$ (Formula 11)

Here, n is a variable representing time series. For example, IN(1) represents an initial value of the input signal, and N(n) represents quantization noise generated in the quantizer 613. Formulas 10 and 11 can be expanded as shown in Formulas 12 and 13, respectively.

$$Y(n)=Y(0)+\Sigma_{k=1}^{n}\{IN(k)-OUT(k-1)\}$$ (Formula 12)

$$N(n)=OUT(n)-Y(0)-\Sigma_{k=1}^{n}\{IN(k)-OUT(k-1)\}$$ (Formula 13)

Formula 13 indicates that N(n) varies depending on the initial value IN(1) which is input to the delta-sigma modulator 61. Formulas 14 and 15 are derived by z-converting Formulas 10 and 11, respectively.

$$Y(z)=z^{-1}Y(z)+IN(z)-z^{-1}OUT(z)$$ (Formula 14)

$$OUT(z)=Y(z)+N(z)$$ (Formula 15)

Formula 16 is derived from Formulas 14 and 15.

$$OUT(z)=IN(z)+(1-z^{-1})\cdot N(z)$$ (Formula 16)

In Formula 17, a temporal waveform out(t) of the output signal is represented by an input signal in(t) and a noise component nn(t).

$$OUT(t)=IN(t)+NN(t)$$ (Formula 17)

Note that in Formula 17, NN(t) is z-converted in a discrete time domain, thereby obtaining $(1-z^{-1})\cdot N(z)$ which is the second term on the right-hand side of Formula 16. In this case, the output signal DSMout_k(t) from the delta-sigma modulator 12-k is represented by Formula 18 where the input signal is represented by IN(t).

$$DSMout\_k(t)=IN(t)+NN\_k(t)$$ (Formula 18)

In Formula 18, NN_k(t) is the second term on the right-hand side in Formula 17 and indicates a noise component generated in the delta-sigma modulator 12-k. A signal-to-noise power ratio SNR_k for the output signal from the delta-sigma modulator 12-k is represented by Formula 19 by taking a ratio of time average values of square components of the input signal and the noise signal.

$$SNR\_k=\overline{IN(t)^2}/\overline{NN\_k(t)^2}$$ (Formula 19)

An output MUXout(t) from the multiplexer 13 is represented by Formula 20 based on Formulas 9 and 18.

$$MUXout(t)\approx IN(t)+\Sigma_{k=1}^{N}NN\_k(t)/N$$ (Formula 20)

A signal-to-noise ratio SNR_MUX for the output signal from the multiplexer 13 is represented by Formula 21 by taking a ratio of squared values for the first term and the second term on the right-hand side of Formula 20.

$$SNR\_MUX=\overline{IN(t)^2}/\overline{(\Sigma_{k=1}^{N}NN\_k(t)/N)^2}$$ (Formula 21)

As shown in Formula 13, noise signals included in the output signals from the delta-sigma modulators 12-1 to 12-N vary depending on the initial value IN(1) which is input to each of the delta-sigma modulators 12-1 to 12-N. Accordingly, N pieces of NN_k(t) (k=1, 2, . . . , N) represent different signals because the setting unit 11 sets different initial values to the delta-sigma modulators 12-1 to 12-N, respectively. Further, since these N NN_k(t) values are uncorrelated, the time average value, which is the product of the noise signals, is approximately zero. Accordingly, Formula 22 is derived from Formula 21.

$$SNR\_MUX=N^2\cdot\overline{IN(t)^2}/\Sigma_{k=1}^{N}\overline{NN\_k(t)^2}$$ (Formula 22)

In this case, the average values of NK_k(t)² which are the squared time average values for the noise signals generated in the delta-sigma modulators 12-1 to 12-N are equal and represented by NNave. In this case, SNR-k representing the SNR for the output signals from the individual delta-sigma modulators and SNR_MUX representing the SNR for the output signal from the multiplexer 13 as shown in Formulas 19 and 22, respectively, are expressed by Formulas 23 and 24, respectively.

$$SNR\_k=\overline{IN(t)^2}/NNave$$ (Formula 23)

$$SNR\_MUX=N\cdot\overline{IN(t)^2}/NNave$$ (Formula 24)

As shown in Formulas 23 and 24, the SNR for the output signal from the multiplexer 13 is improved by a factor of N as compared with the SNR for the output signals from the respective delta-sigma modulators 12-1 to 12-N. This indicates that the SNR is improved in proportion to the number of delta-sigma modulators.

Figure 7:
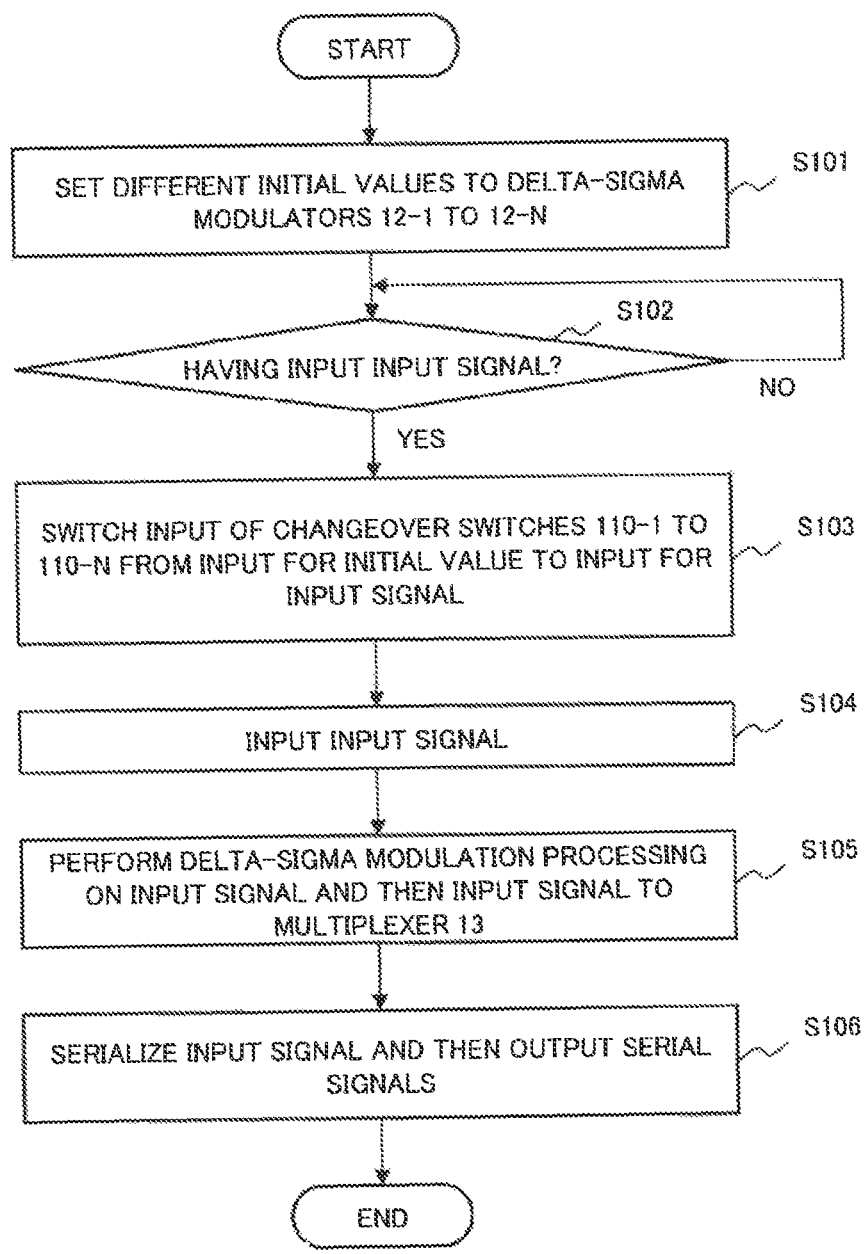
FIG. 7 is a flowchart illustrating an operation of the digital modulation device according to the first example embodiment of the present invention.

Next, the operation (processing) of the digital modulation device 10 according to this example embodiment will be described with reference to the flowchart of FIG. 7.

The setting unit 11 sets initial values which differ from each other to the delta-sigma modulators 12-1 to 12-N, respectively (step S101). When the digital modulation device 10 has not input the input signal (No in step S102), the digital modulation device 10 stands by. When the digital modulation device 10 has input the input signal (Yes in step S102), the setting unit 11 switches the input of each of the changeover switch 110-1 to 110-N from the input for the initial value to the input for the input signal (step S103).

The delta-sigma modulators 12-1 to 12-N input the input signal (step S104). The delta-sigma modulators 12-1 to 12-N perform delta-sigma modulation processing on the input signal, and output the processing result to the multiplexer 13 (step S105). The multiplexer 13 serializes the signals input from the delta-sigma modulators 12-1 to 12-N, and then outputs the serial signals (step S106). Thus, the whole processing is finished.

The digital modulation device 10 according to this example embodiment can efficiently improve the signal-to-noise power ratio without increasing the operating frequency for the delta-sigma modulators. This is because the setting unit 11 sets initial values which differ from each other to the delta-sigma modulators 12-1 to 12-N, respectively, and the multiplexer 13 serializes the processing results obtained after the delta-sigma modulators 12-1 to 12-N perform delta-sigma modulation processing on the input signal, thereby outputting serial signals.

An advantageous effect achieved by the digital modulation device 10 according to this example embodiment will be described in detail below.

In general, the SNR for the signals generated by the delta-sigma modulators can be improved by increasing the operating frequency for the delta-sigma modulators. On the other hand, the rate of the operating frequency is limited by the device performance. Accordingly, the SNR is determined depending on the device performance.

On the other hand, the digital modulation device 10 according to this example embodiment can improve the SNR without increasing the operating frequency for the delta-sigma modulators. Specifically, in the digital modulation device 10 according to this example embodiment, the multiplexer 13 is required to operate at a rate that is N times higher than that of the delta-sigma modulators 12-1 to 12-N. However, since the configuration of the multiplexer 13 is much simpler than that of the delta-sigma modulators 12-1 to 12-N, the speed limit for the multiplexer 13 is sufficiently high. Accordingly, the digital modulation device 10 according to this example embodiment can generate digital signals with a high SNR, without increasing the operation speed for the delta-sigma modulators.

Note that there is a method for time multiplexing by shifting the phase of clock signals to be supplied to the delta-sigma modulators. In this method, the SNR is improved by increasing an effective sample rate to a value equal to the product of the sample rate of the delta-sigma modulators and the number of the delta-sigma modulators. However, this method requires a circuit for supplying a plurality of clock signals having different phases. On the other hand, in this example embodiment, since the clock signals to be supplied to the delta-sigma modulators 12-1 to 12-N are the same (common), the configuration of the circuit for supplying the clock signals is simple. Therefore, the circuit size and power consumption can be suppressed as compared with the above-mentioned method.

Figure 17:
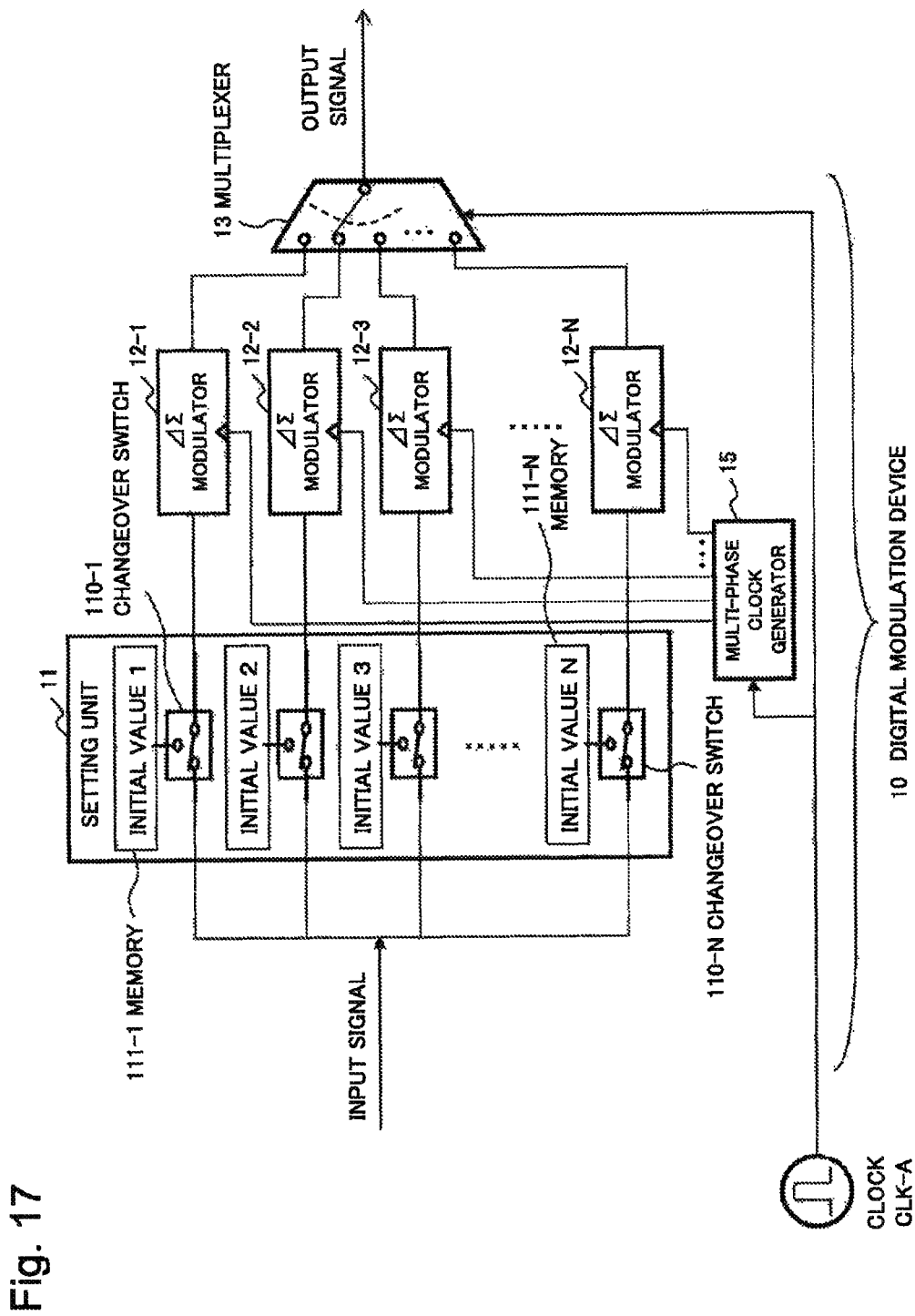
FIG. 17 is a block diagram illustrating another configuration of the digital modulation device according to the first example embodiment of the present invention.

In a modified example of this example embodiment, as illustrated in FIG. 17, the frequency divider 14 may be replaced by a multi-phase clock generator 15. In this case, the effective sample rate can be increased by shifting the phase of the clock signals to be supplied to the delta-sigma modulators 12-1 to 12-N, like in the method for time multiplexing described above. The circuit size and power consumption in the multi-phase clock generator 15 are larger than those of the frequency divider 14. However, in this case, the digital modulation device 10 can further improve the SNR by a combination of the SNR improvement effect obtained by setting of the initial values and the improvement effect obtained using the effective sample rate.

Figure 5:
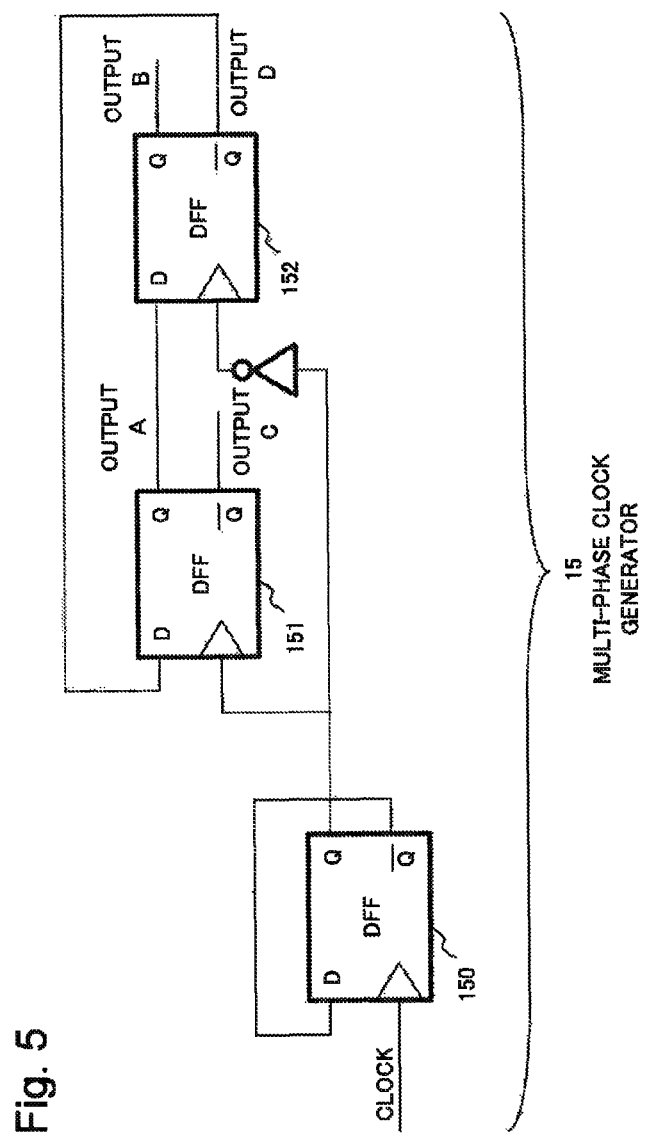
FIG. 5 is a diagram illustrating a configuration of a multi-phase clock generator according to the first example embodiment of the present invention.
Figure 6:
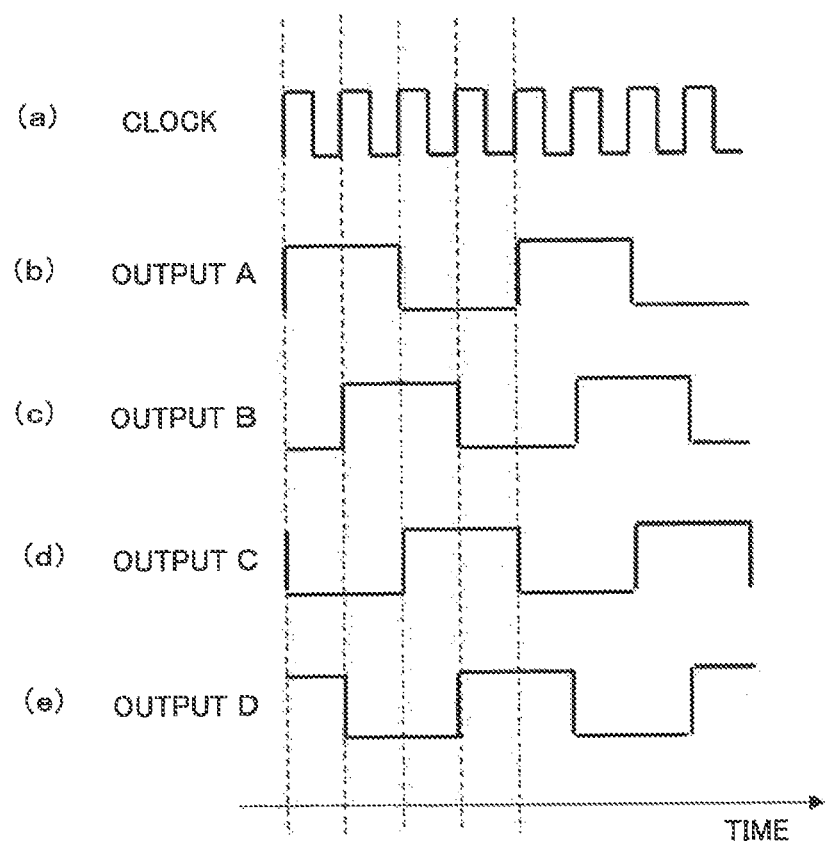
FIG. 6 is a diagram illustrating a time chart for a clock signal input from the multi-phase clock generator to the delta-sigma modulator when the multi-phase clock generator according to the first example embodiment of the present invention has the configuration illustrated in FIG. 5.

FIG. 5 illustrates a configuration example of the multi-phase clock generator 15 when four-phase clock signals are generated. The multi-phase clock generator 15 illustrated in FIG. 5 includes DFFs 150 to 152. The four-phase clock signals having different phases as illustrated in FIG. 6 are output from output terminals A to D of the DFFs 151 and 152. Specifically, FIG. 6 illustrates a time chart related to the clock signals to be input to the delta-sigma modulators 12-1 to 12-N, respectively, by the multi-phase clock generator 15 when the multi-phase clock generator 15 has the configuration illustrated in FIG. 5. The number of DFFs in the multi-phase clock generator 15 is larger by one than the number of DFFs in the frequency divider 14 illustrated in FIG. 3, so that the circuit size and power consumption in the multi-phase clock generator 15 are larger than those in the frequency divider 14.

Further, in the digital modulation device 10 according to this example embodiment, the multiplexer 13 selects any one of the output signals from the delta-sigma modulators 12-1 to 12-N. Thus, the number of values taken by the output signal from the digital modulation device 10, or the value of the bit width of the signal is equal to the number of values taken by the output signal from each delta-sigma modulator, or the value of the bit width of the signal.

Figure 13:
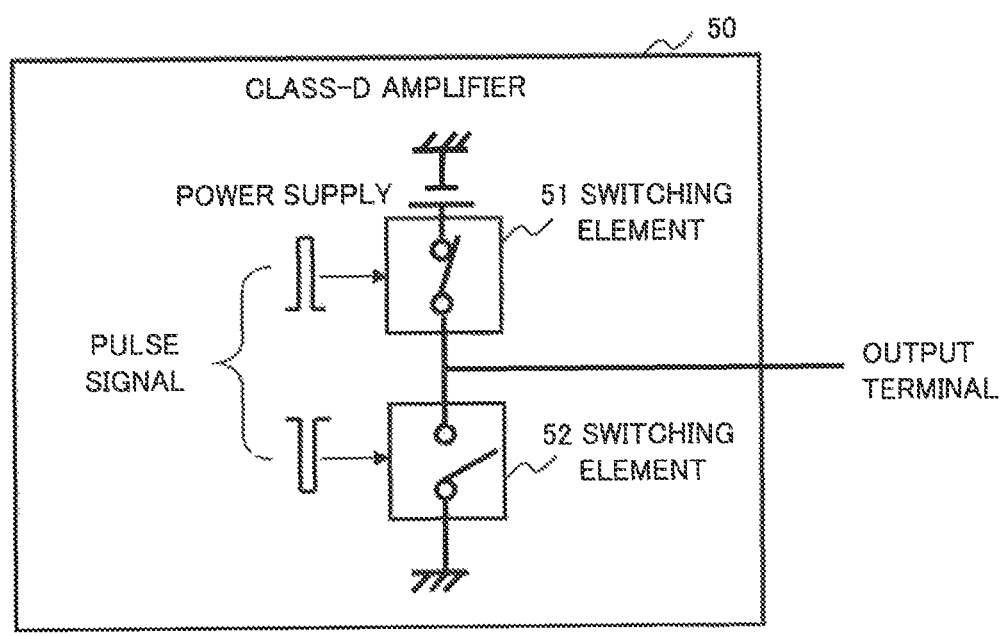
FIG. 13 is a diagram illustrating a configuration of a typical class-D amplifier.

The effect of improving the SNR is obtained by a signal that is obtained by adding the output signals from the delta-sigma modulators 12-1 to 12-N. In addition, in the SNR, a value which can be taken by the signal or a value of the bit width increases depending on the number of delta-sigma modulators to be added. In other words, the digital modulation device 10 according to this example embodiment can improve the SNR while maintaining the number of output values, or the value of the bit width at the same value as that of each delta-sigma modulator. Accordingly, for example, when the digital modulation device 10 according to this example embodiment is a digital modulation device including binary output type delta-sigma modulators, the output signal from the digital modulation device 10 according to this example embodiment can be input to the class-D amplifier which performs the binary operation as illustrated in FIG. 13.

<Second Example Embodiment>

Figure 8:
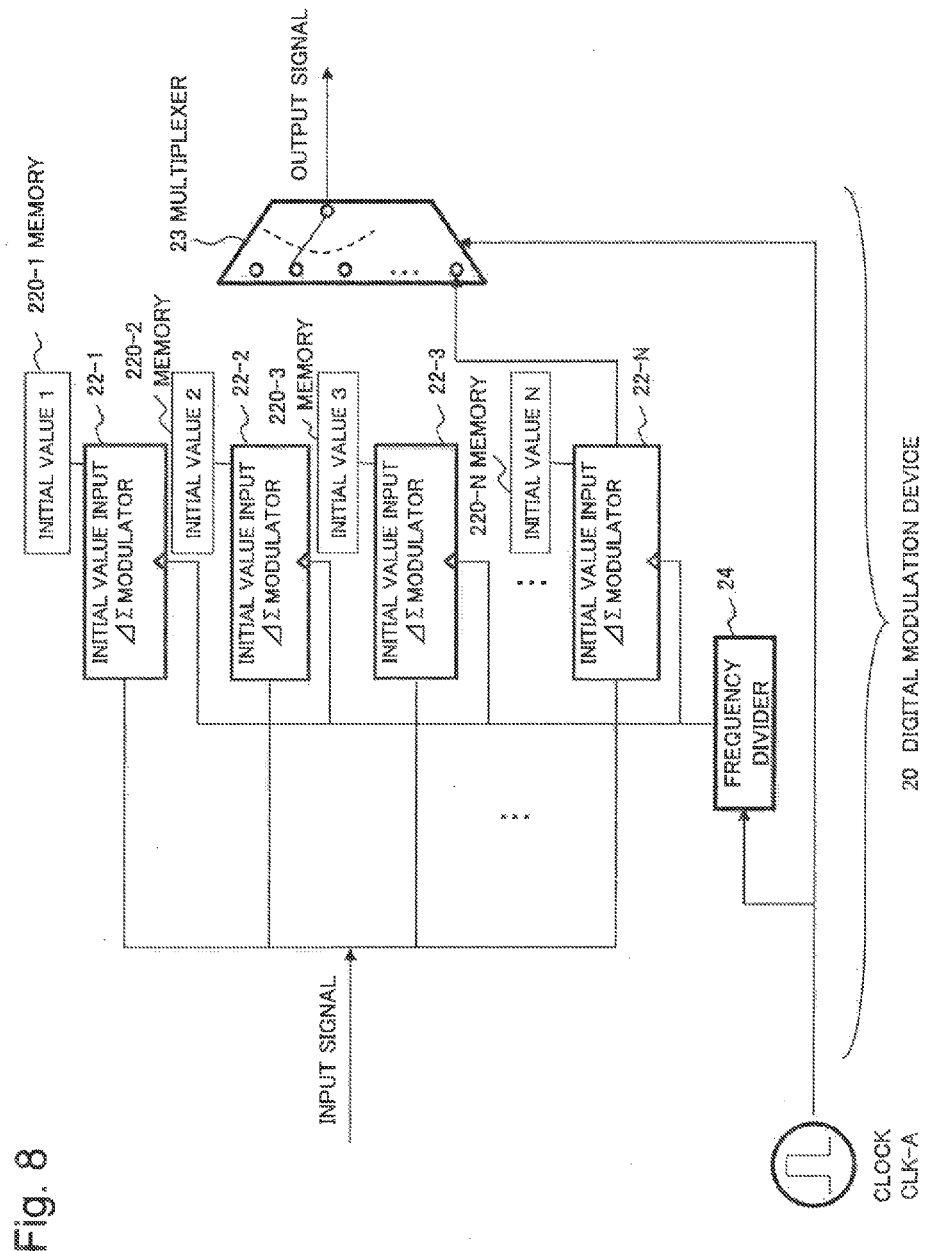
FIG. 8 is a block diagram illustrating a configuration of a digital modulation device according to a second example embodiment of the present invention.

FIG. 8 is a block diagram conceptually illustrating a configuration of a digital modulation device 20 according to a second example embodiment. The digital modulation device 20 according to this example embodiment is different from the digital modulation device 10 according to the first example embodiment in the following configurations.

The delta-sigma modulators 12-1 to 12-N according to the first example embodiment are respectively replaced by initial value input delta-sigma modulators 22-1 to 22-N.

The initial value input delta-sigma modulators 22-1 to 22-N include the functions of the setting unit 11 according to the first example embodiment. Specifically, the initial value input delta-sigma modulators 22-1 to 22-N respectively include memories 220-1 to 220-N which store initial values.

A multiplexer 23 according to this example embodiment has a function similar to that of the multiplexer 13 according to the first example embodiment, and a frequency divider 24 according to this example embodiment has a function similar to that of the frequency divider 14 according to the first example embodiment.

Figure 9:
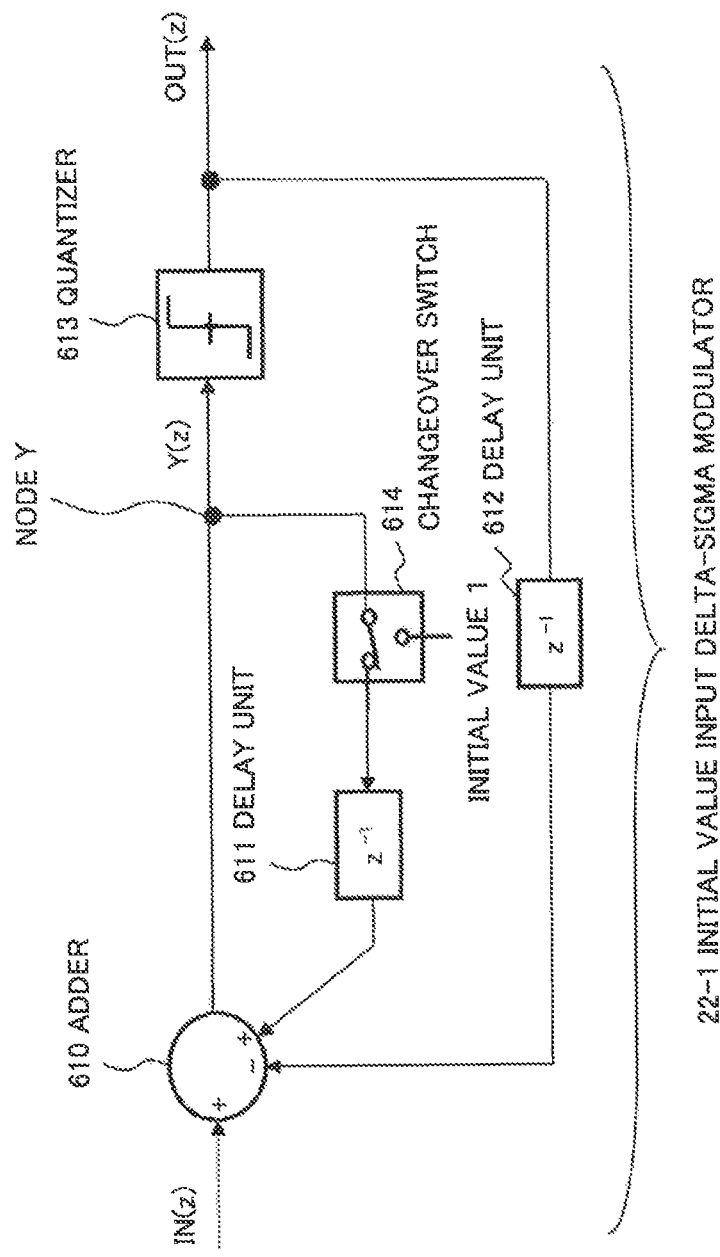
FIG. 9 is a diagram illustrating a configuration of an initial value input delta-sigma modulator according to the second example embodiment of the present invention.

FIG. 9 is a diagram illustrating a specific configuration example of the initial value input delta-sigma modulator 22-1. The configurations of the initial value input delta-sigma modulators 22-2 to 22-N are also similar to the configuration of the initial value input delta-sigma modulator 22-1. As illustrated in FIG. 9, the initial value input delta-sigma modulator 22-1 according to this configuration example includes a changeover switch 614 which is capable of inputting an externally supplied initial value signal to an internal node Y. The configuration of the initial value input delta-sigma modulator 22-1 including the adder 610, the delay units 611 and 612, and the quantizer 613 is similar to the configuration of the delta-sigma modulator 61 illustrated in FIG. 16.

The digital modulation device 20 according to this example embodiment can efficiently improve the signal-to-noise power ratio without increasing the operating frequency for the delta-sigma modulators. This is because the initial value input delta-sigma modulators 22-1 to 22-N input initial values which differ from each other, respectively, and the multiplexer 23 serializes the processing results obtained after the initial value input delta-sigma modulators 22-1 to 22-N perform delta-sigma modulation processing on the input signal, thereby outputting the serial signals.

An advantageous effect achieved by the digital modulation device 20 according to this example embodiment will be described in detail below.

The above-mentioned Formula 13 indicates that the noise signals included in the output signals from the delta-sigma modulators depend on the initial value related to the internal node Y. Accordingly, in the initial value input delta-sigma modulators 22-1 to 22-N according to this example embodiment, initial values which differ from each other are supplied to the node Y, and thus the noise signals included in the output signals from the initial value input delta-sigma modulators 22-1 to 22-N are signals which differ from each other, like in the digital modulation device 10 according to the first example embodiment.

Thus, as shown in Formulas 23 and 24 described above, the SNR for the output signal output from the digital modulation device 20 according to this example embodiment can be improved by a factor of N as compared with the SNR for the output signals from the initial value input delta-sigma modulators 22-1 to 22-N. This indicates that the SNR for the digital modulation device 20 is improved in proportion to the number of the initial value input delta-sigma modulators. In other words, unlike the typical delta-sigma modulator, the digital modulation device 20 according to this example embodiment can generate digital signals with a high SNR, without increasing the operation speed for the delta-sigma modulators.

Note that the location where the initial values are externally input to the initial value input delta-sigma modulators 22-1 to 22-N is not limited to the node Y illustrated in FIG. 9, but instead may be another internal node, an input node, or the like. Also in higher-order delta-sigma modulators having a large circuit size, the location where the initial values are externally input may be the internal node or the input node.

Another example of the method for externally inputting the initial values to the delta-sigma modulators is a method using input signals having initial values which differ from each other in a header portion thereof. In this case, the functions, such as the setting unit 11 according to the first example embodiment and the changeover switch 614 according to the second example embodiment, which switch the input for the initial value and the input for the input signal on which modulation processing is performed, are not required.

<Third Example Embodiment>

Figure 10:
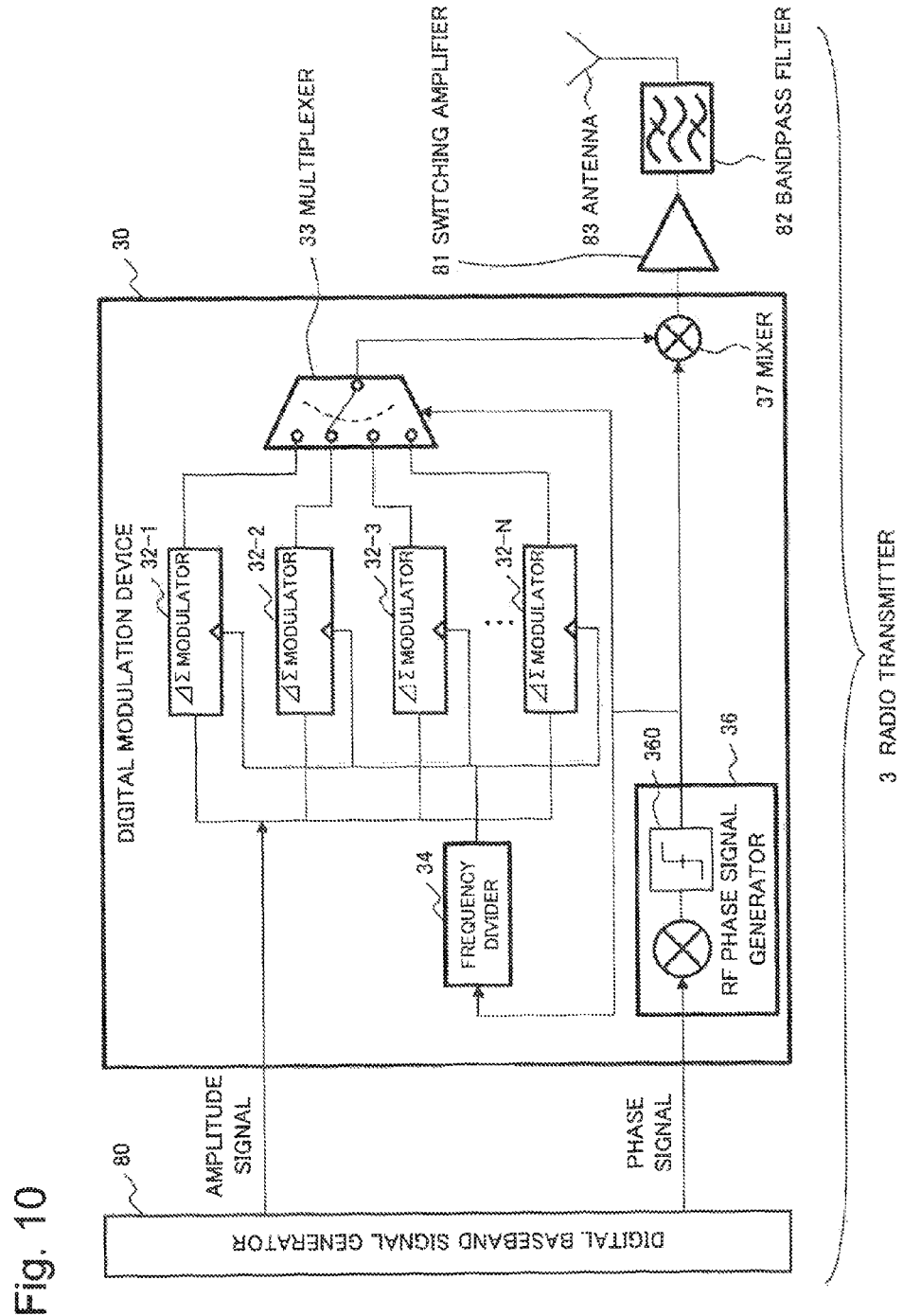
FIG. 10 is a block diagram illustrating a configuration of a radio transmitter according to a third example embodiment of the present invention.

FIG. 10 is a block diagram conceptually illustrating a configuration of a radio transmitter 3 according to a third example embodiment. The radio transmitter 3 according to this example embodiment includes a digital modulation device 30, the digital baseband signal generator 80, a switching amplifier 81, the bandpass filter 82, and the antenna 83.

The digital modulation device 30 includes delta-sigma modulators 32-1 to 32-N, a multiplexer 33, a frequency divider 34, an RF phase signal generator 36, and a mixer (multiplication unit) 37. The delta-sigma modulators 32-1 to 32-N, the multiplexer 33, and the frequency divider 34 have functions similar to those of the components included in the digital modulation device 10 according to the first example embodiment or the digital modulation device 20 according to the second example embodiment. Specifically, the digital modulation device 30 has at least functions equivalent to the functions of the digital modulation device 10 or the digital modulation device 20.

The digital baseband signal generator 80 outputs an amplitude signal and a phase signal, which are included in a radio signal, to the digital modulation device 30. The RF phase signal generator 36 generates a rectangular RF phase signal based on the phase signal input from the digital baseband signal generator 80, and outputs the generated rectangular RF phase signal to each of the multiplexer 33 and the frequency divider 34 as a clock signal. The RF phase signal generator 36 also outputs the rectangular RF phase signal to the mixer 37.

Figure 15:
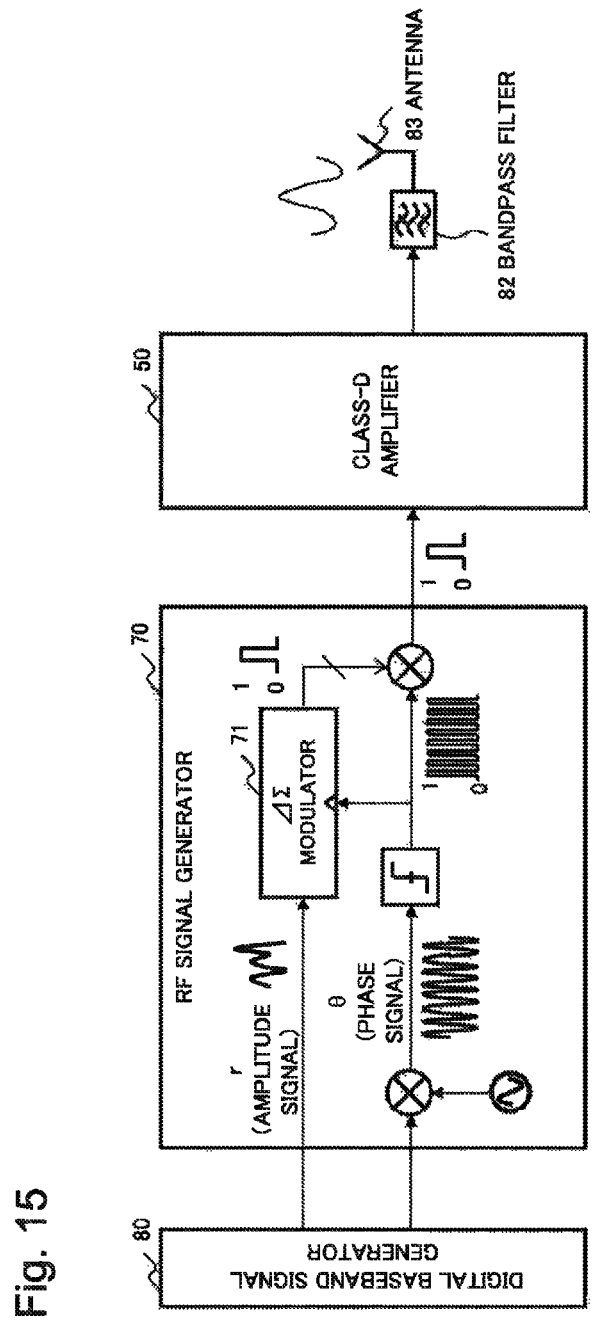
FIG. 15 is a diagram illustrating a second configuration example of the transmitter using the typical class-D amplifier.

The radio transmitter 3 according to this example embodiment has a configuration in which a delta-sigma modulator 71 is replaced by the digital modulation device 10 according to the first example embodiment or the digital modulation device 20 according to the second example embodiment in the typical radio transmitted illustrated in FIG. 15.

As shown in Formulas 25 and 26, a radio signal RF(t) is generally represented using an amplitude signal r(t) and a phase signal θ(t).

$$RF(t)=r(t)\cdot RF\_\theta(t) \quad\quad\quad \text{(Formula 25)}$$

$$RF\_\theta(t)=\cos(\omega c\cdot t+\theta(t)) \quad\quad\quad \text{(Formula 26)}$$

Here, $\omega_c$ represents an angular frequency obtained by multiplying 2π (π represents pi) by a carrier frequency fc. In this example embodiment, the digital baseband signal generator 80 generates the amplitude signal r(t) and the phase signal θ(t). The phase signal θ(t) is upconverted into an RF band by the RF phase signal generator 36, and thus is converted into an RF phase signal, i.e., RF_θ(t) shown in Formulas 25 and 26.

The RF phase signal is formed into a rectangular shape by a quantizer 360 which compares the magnitude of signals using zero as a threshold in the RF phase signal generator 36. In other words, the RF phase signal is converted into a rectangular RF phase signal RF_rec_θ(t) shown in Formula 27. The digital modulation device 30 uses the rectangular RF phase signal as a clock signal.

$$RF\_rec\_\theta(t)=RF\_\theta(t)+HM(t) \quad\quad\quad \text{(Formula 27)}$$

HM(t) in Formula 27 represents a harmonic component included in the RF phase signal RF_θ(t).

The amplitude signal r(t) is input to the digital modulation device 30. An output signal Dmod(t) from the multiplexer 33 in the digital modulation device 30 is a signal obtained by substituting r(t) into IN(t) on the right-hand side of Formula 20, and is represented by Formula 28.

$$Dmod(t)=r(t)+\Sigma_{k=1}^{N} NN\_k(t)/N \qquad \text{(Formula 28)}$$

The mixer 37 multiples the output signal Dmod(t) from the multiplexer 33 in the digital modulation device 30 by the rectangular RF phase signal, thereby generating a digital RF signal RFdig(t) represented by Formula 29.

$$RFdig(t)=r(t)\cdot RF\_\theta(t)+r(t)\cdot HM(t)+(RF\_\theta(t)+HM(t))\cdot \Sigma_{k=1}^{N} NN\_k(t)/N \qquad \text{(Formula 29)}$$

The first term on the right-hand side of Formula 29 corresponds to the radio signal RF(t) as represented by Formula 25. In the radio transmitter 3, the switching amplifier 81 amplifies the digital RF signal and then only desired components are allowed to pass. In other words, the digital RF signal is radiated from the antenna 83 through the bandpass filter 82 which removes the second and subsequent terms on the right-hand side of Formula 29.

When quantizers respectively included in the delta-sigma modulators 32-1 to 32-N in the digital modulation device 30 are of a binary (high/low) output type, the output signal from the multiplexer 33 in the digital modulation device 30 has two values. Since the rectangular RF phase signal also has two values, the two values (high/low) are allocated to "1" and "0", respectively, and also the output signal from the mixer 37 that is the product of the values has the two values of "1" and "0". In this case, the output signal from the mixer 37 can be input to the switching amplifier 81, which is a class-D amplifier that is operable with high efficiency and does not require any bias current, as illustrated in FIG. 13.

Figure 11:
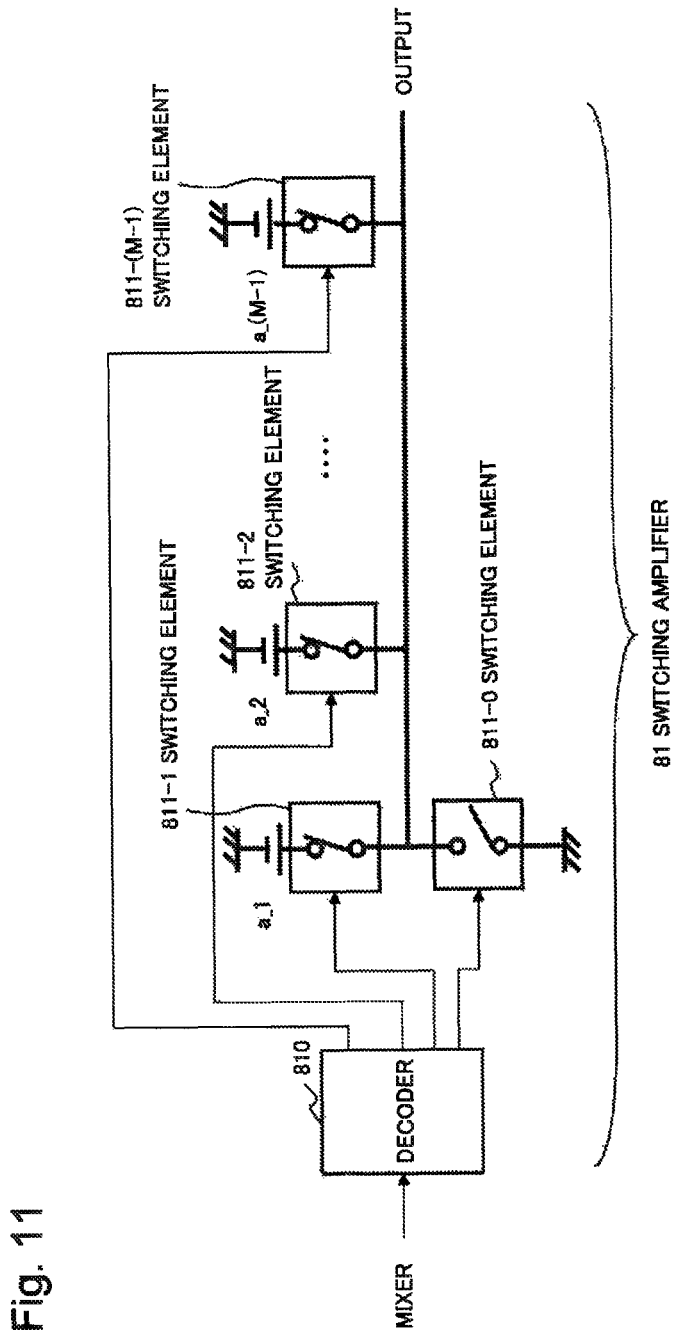
FIG. 11 is a diagram illustrating a configuration of a switching amplifier according to the third example embodiment of the present invention.

When the output from each of the delta-sigma modulators 32-1 to 32-N is represented by M values (0, a_1, a_2, ..., and a_(M−1)), respectively, including "0", and when the two values of the rectangular RF signal are allocated to "1" and "0", respectively, the output from the mixer 37 is also represented by M values, like the output signals from the delta-sigma modulators 32-1 to 32-N. In this case, the output signal from the mixer 37 is input to M switching elements 811-0 to 811-(M−1), which are included in the switching amplifier 81 serving as a multi-power supply, through a decoder 810 as illustrated in FIG. 11. The number of M values is equal to the number of M values output from the mixer 37. The decoder 810 turns on only one of the switching elements 811-0 to 811-(M−1) depending on the value output from the mixer 37. Through this operation, the switching amplifier 81 amplifies the output signal from the mixer 37 and outputs the amplified signal.

Note that in Formula 29, the terms including HM(t) representing the RF phase signal have frequency components higher than a desired band, and thus can be easily removed by the bandpass filter 82. Accordingly, a signal Ant(t) output from the antenna 83 is approximately represented by Formula 30.

$$Ant(t) = r(t)\cdot RF\_\theta(t) + RF\_\theta(t)\cdot \sum_{k=1}^{N} NN\_k(t)/N$$

$$= RF(t)\cdot \left(1 + \sum_{k=1}^{N} NN\_k(t)/N/r(t)\right) \qquad \text{(Formula 30)}$$

SNR_ant representing the SNR for the signal Ant(t) is represented by Formula 31 by taking a ratio of two terms in brackets on the right-hand second term.

$$SNR\_ant=\overline{r(t)^2}/(\Sigma_{k=1}^{N} NN\_k(t)/N)^2 \qquad \text{(Formula 31)}$$

Formula 31 is a formula in which IN(t) in Formula 21 is replaced by r(t). Accordingly, SNR_ant_conv and SNR_ant can be obtained by a calculation similar to the process in which Formulas 23 and 24 are derived from Formula 21. SNR_ant_conv represents the SNR for the signal output from the antenna by the radio transmitter using the typical delta-sigma modulation device. SNR_ant represents the SNR for the signal output from the antenna 83 by the radio transmitter 3 according to this example embodiment. SNR_ant_conv and SNR_ant are represented by Formulas 32 and 33, respectively.

$$SNR\_ant\_conv=\overline{r(t)^2}/NNave \qquad \text{(Formula 32)}$$

$$SNR\_ant=N\cdot\overline{r(t)^2}/NNave \qquad \text{(Formula 33)}$$

The digital modulation device 30 according to this example embodiment can efficiently improve the signal-to-noise power ratio without increasing the operating frequency for the delta-sigma modulators. This is because the delta-sigma modulators 32-1 to 32-N input initial values which differ from each other and the multiplexer 33 serializes the processing results obtained after the delta-sigma modulators 32-1 to 32-N perform delta-sigma modulation processing on the input signal, and outputs the serial signals.

As shown in Formulas 32 and 33, in the radio transmitter 3 according to this example embodiment, the SNR output from the antenna is higher by a factor of N than that in the typical radio transmitter. In other words, the radio transmitter 3 according to this example embodiment can generate radio signals with a higher SNR than that in the typical radio transmitter, without increasing the operation speed for the delta-sigma modulators.

<Fourth Example Embodiment>

Figure 12:
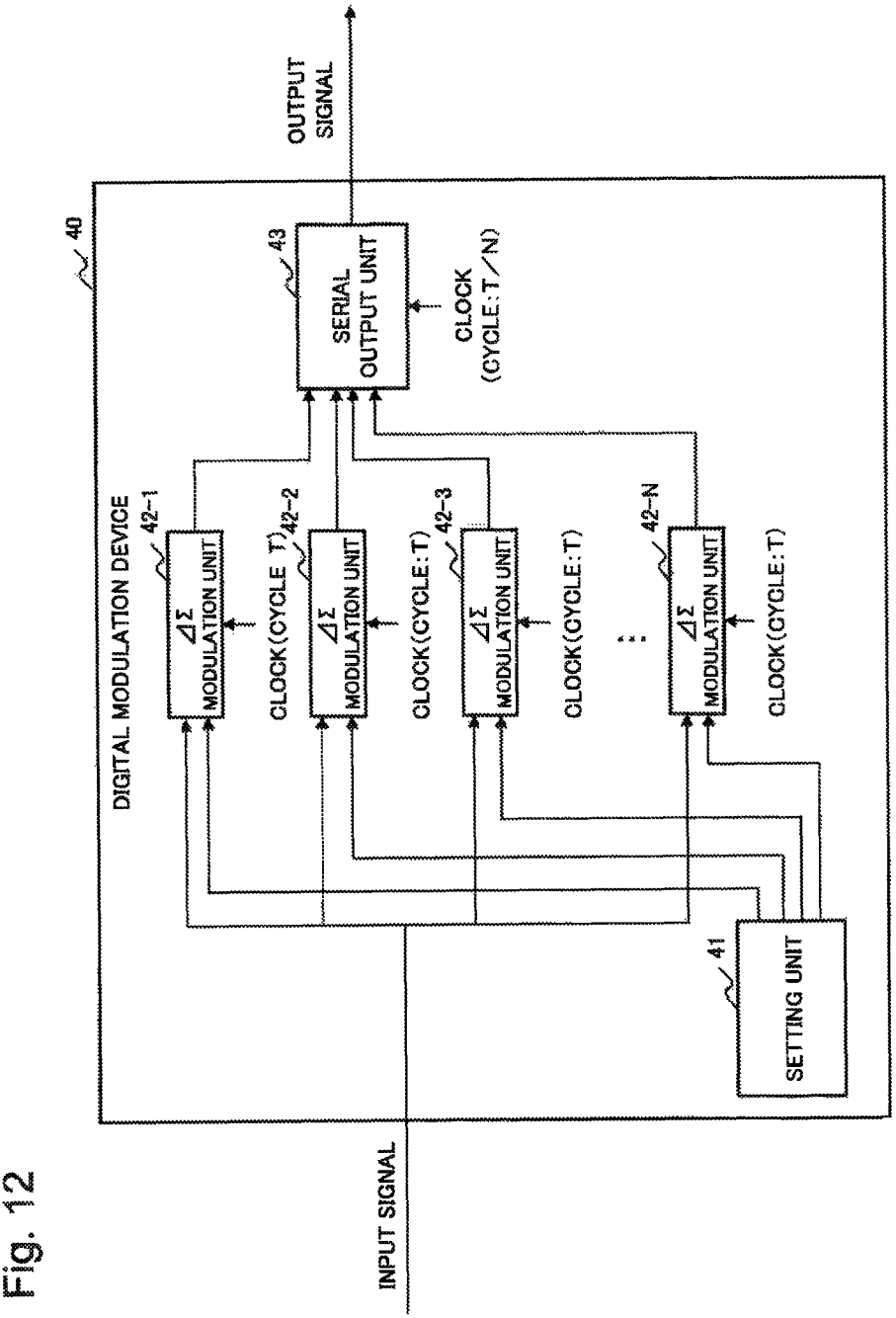
FIG. 12 is a block diagram illustrating a configuration of a digital modulation device according to a fourth example embodiment of the present invention.

FIG. 12 is a block diagram conceptually illustrating a configuration of a digital modulation device 40 according to a fourth example embodiment.

The digital modulation device 40 according to this example embodiment includes a setting unit 41, N (N is an integer equal to or greater than 2) delta-sigma modulation units 42-1 to 42-N, and a serial output unit 43.

The setting unit 41 sets initial values which differ from each other to the N delta-sigma modulation units 42-1 to 42-N, respectively.

The delta-sigma modulation units 42-1 to 42-N perform delta-sigma modulation processing on the input signal for each clock cycle T indicated by a first clock signal, and output modulated signals including a noise signal having a value that varies depending on the initial values.

The serial output unit 43 sequentially serializes the modulated signals output from the delta-sigma modulation units 42-1 to 42-N for each clock cycle T/N indicated by a second clock signal having a clock cycle that is 1/N of the clock cycle of the first clock signal and outputs the serial signals.

The digital modulation device 40 according to this example embodiment can efficiently improve the signal-to-noise power ratio without increasing the operating frequency for the delta-sigma modulators. This is because the delta-sigma modulation units 42-1 to 42-N input initial values which differ from each other and the serial output unit 43 serializes the processing results obtained after the delta-sigma modulation units 42-1 to 42-N perform delta-sigma modulation processing on the input signal, thereby outputting serial signals.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-199503, filed on Sep. 30, 2014, the disclosure of which is incorporated herein in its entirety by reference.

REFERENCE SIGNS LIST

10 Digital modulation device
11 Setting unit
110-1 to 110-N Changeover switch
111-1 to 111-N Memory
12-1 to 12-N Delta-sigma modulator
13 Multiplexer
14 Frequency divider
140, 141 DFF
15 Multi-phase clock generator
150 to 152 DFF
20 Digital modulation device
22-1 to 22-N Initial value input delta-sigma modulator
220-1 to 220-N Memory
23 Multiplexer
24 Frequency divider
3 Radio transmitter
30 Digital modulation device
32-1 to 32-N Delta-sigma modulator
33 Multiplexer
34 Frequency divider
36 RF phase signal generator
360 Quantizer
37 Mixer
40 Digital modulation device
41 Setting unit
42-1 to 42-N Delta-sigma modulation unit
43 Serial output unit
50 Class-D amplifier
51, 52 Switching element
60 RF signal generator
61, 62 Delta-sigma modulator
610 Adder
611, 612 Delay unit
613 Quantizer
614 Changeover switch
70 RF signal generator
71 Delta-sigma modulator
80 Digital baseband signal generator
81 Switching amplifier
810 Decoder
811-0 to 811-(M−1) Switching element
82 Bandpass filter
83 Antenna

The invention claimed is:

1. A digital modulation device comprising:
an input unit;
N delta-sigma modulation units; and
an output unit, wherein
N is an integer greater than or equal to 2,
the input unit is configured to:
input initial values which differ from each other into the N delta-sigma modulation units; and then,
input a same first signal into the N delta-sigma modulation units,
each of the N delta-sigma modulation units is configured to:
output a second signal by performing delta-sigma modulation processing on the first signal for each first clock cycle, and
the output unit is configured to:
sequentially output each second signal for each one Nth of the first clock cycle.

2. The digital modulation device according to claim 1, wherein each of the N delta-sigma modulation units is configured to operate in accordance with clock signals, phases of which differ from each other.

3. The digital modulation device according to claim 1, wherein the input unit is configured to input the initial values into any nodes of the N delta-sigma modulation units other than input nodes, wherein
the input nodes are:
nodes of the N delta-sigma modulation units, and
nodes into which the first signal is inputted.

4. The digital modulation device according to claim 1, wherein the input unit is configured to input third signals into the N delta-sigma modulation units, wherein
the third signals comprise the initial values in header, and
each third signal comprises the same first signal following each header.

5. A wireless communication device comprising the digital modulation device according to claim 1.

6. A digital modulation method comprising:
inputting initial values which differ from each other into N delta-sigma modulation units; and then,
inputting a same first signal into the N delta-sigma modulation units;
outputting, by each of the N delta-sigma modulation units, a second signal by performing delta-sigma modulation on the first signal for each first clock signal; and
sequentially outputting each second signal for each one Nth of the first clock cycle, wherein
N is an integer greater than or equal to 2.

* * * * *